United States Patent [19]

Deppe

[11] 4,162,210

[45] Jul. 24, 1979

[54] METHOD FOR COVERING A FIRST LAYER OR LAYER SEQUENCE SITUATED ON A SUBSTRATE WITH AN ADDITIONAL SECOND LAYER BY A SPUTTERING-ON PROCESS

[75] Inventor: Hans-Raimund Deppe, Munich, Fed. Rep. of Germany

[73] Assignee: Siemens Aktiengesellschaft, Berlin & Munich, Fed. Rep. of Germany

[21] Appl. No.: 872,433

[22] Filed: Jan. 26, 1978

[30] Foreign Application Priority Data

Feb. 10, 1977 [DE] Fed. Rep. of Germany ....... 2705611

[51] Int. Cl.$^2$ .............................................. C23C 15/00
[52] U.S. Cl. .............................................. 204/192 EC
[58] Field of Search .................... 204/192 E, 192 EC; 156/643

[56] References Cited

U.S. PATENT DOCUMENTS 4,036,723  7/1977  Schwartz et al. ............. 204/192 EC

OTHER PUBLICATIONS

T. N. Kennedy "Sputtered Insulator Film Contouring Over Substrate Topography" *J. Vac. Sci. Tech.*, vol. 13, pp. 1135-1137 (1976).

Primary Examiner—Aaron Weisstuch
Attorney, Agent, or Firm—Hill, Van Santen, Steadman, Chiara & Simpson

[57] ABSTRACT

A method is disclosed for eliminating under-etchings. In a substrate having a lower silicon dioxide layer thereon, a polysilicon layer on the silicon dioxide layer, and an upper silicon dioxide layer on the polysilicon layer, an etched window provided in the layers has first under-etchings formed at an edge of the lower silicon dioxide layer adjacent the substrate and a second under-etching formed at an edge of the polysilicon layer. A sputtering source is provided with a given target voltage. A grid potential is applied to the substrate wherein the grid potential is between one-tenth and one-third of the target voltage. A layer is then sputter deposited in the etching window for filling in the first under-etching by re-emission from the surface of the substrate and for sloping the edge of the polysilicon layer at the second under-etching. An overhanging portion of the upper silicon dioxide layer is also removed at the second under-etching by re-emission during the sputter deposition.

11 Claims, 4 Drawing Figures

METHOD FOR COVERING A FIRST LAYER OR LAYER SEQUENCE SITUATED ON A SUBSTRATE WITH AN ADDITIONAL SECOND LAYER BY A SPUTTERING-ON PROCESS

BACKGROUND OF THE INVENTION

The invention relates to a method for covering a first layer or layer sequence situated on a substrate with an additional second layer by sputtering deposition.

In semiconductor technology for the production of integrated circuits in single or multiple layers which are situated on a semiconductor substrate, such as for the purpose of contacting semiconductor regions, windows are etched by a wet-chemical process. Subsequently, additional layers, for example metal layers, are deposited as conductor paths onto the layer provided with a structure in the aforementioned manner. Such methods are utilized, for example, in the Si-Si-gate process in which a silicon dioxide layer, then a polycrystalline silicon layer, and subsequently another silicon dioxide layer are deposited on a silicon substrate, and in the further process contact windows are etched through to the silicon substrate through this multiple layer. Under etching (or sub-etching) structures are formed during the etching of such layer sequences due to the different etching rates of the individual layers. This leads to difficulties in subsequent coating processes in which, for example, a contact hole which is produced is filled and coated with a conductor path layer, because the deposited conductor path layer can tear off at the under-etchings. Such under-etchings can additionally lead to more difficulties since residues of the etching compound and thus contaminants settle therein which cannot completely be removed from the very small hollow spaces. Such etching compound residues can attack subsequently mounted layers and lead to electrical instabilities, for example, by means of Na+ ions and can thus lead to the breakdown of individual components, particularly in integrated circuits. Therefore, etched structures without such under-etchings and having a slope angle of approximately 45° are desirable.

In accordance with a known method, allowances can be made for the overhanging edges of such under-etchings or sub-etchings when the under-etching can be covered by means of a subsequent "flowglass" coating. In such a "flowglass" coating, a glass layer, for example a phosphorus glass layer, is deposited before etching of the structures. During the etching process the glass layer is more strongly attacked than the $SiO_2$ layer lying underneath. This leads to an oblique surface of the $SiO_2$ structures without an interfering under-etching. After the etching of the structures, for example of the contact holes, the phosphorus glass layer is caused to melt and flow with the aid of a heat treatment whereby the edges of the etching structures are utilized. However, the disadvantage of this technique is that in structures of very small dimensions, for example, in the production of contacts and conductor paths having a width of 2.5 µm and a reciprocal or mutual distance of such magnitude, a sufficient edge covering can no longer be guaranteed. A method is desirable in which, simultaneously with the mounting of the additional layer or layers such as the conductor paths or contact metal layers, the under-etching structures, unavoidable with wet-chemical etching, are filled, or overhanging flanks of such sub-etching structures are removed.

SUMMARY OF THE INVENTION

It is an object of the invention to provide a method for covering a first layer or layer sequence situated on a substrate with a second layer, such that a filling of under-etchings or a removal or beveling of overhanging sides of such under-etchings can occur.

According to the invention, during the depositing of a layer onto a substrate with the aid of a high frequency (RF) sputtering source, a re-emission of the sputtered-on particles can be obtained by means of applying a substrate grid potential to the substrate. (IBM J. Res. Develop 1970, 172–125, 176–181). As this re-emission proceeds from the surface of the substrate in all space directions, material can be deposited even under an overhanging edge of an under-etching structure. The greater the substrate grid potential is in such a RF sputtering process, the more material is dusted back from the substrate surface. However, the application of a substrate grid potential effects a removal and thus a sloping or beveling of the overhanging flanks of the under-etching structure along with the re-emission of the sputtered-on material. Experiments with the invention, with a target voltage for the sputtering source of 1500 Volts and a substrate grid potential of 350 Volts, an etching structure situated on a polysilicon layer and having an edge angle of about 70°, is sloped or beveled to an edge angle of about 20°. Since such an edge angle is too small for the conductor path structure provided, a given edge angle can be adjusted by first undertaking the operation with sputtering conditions in which a high re-emission occurs. During the sputter deposition process, the substrate grid potential is then altered such that the re-emission and thus the edge sloping at the etched structures is smaller. As in this case, however, a re-emission always still occurs and one obtains a proper edge covering of the rims of the etched-in structure.

In accordance with an additional embodiment of the invention, the sputtering-on is only carried out until the sub-etchings or under-etchings of the etched-in structures are filled. Then additional material is deposited with an additional process, for example, with the aid of a CVD deposition process or with $SiO_2$ sputtering, using a lesser substrate grid potential and in which a negligible removal of the side to be sputtered results in the obtaining of a proper edge covering (for example at 10 to 12% of the target voltage). Instead of such a CVD deposition process, a thermal oxidation, for example, can also be utilized for the deposition of $SiO_2$ onto a polysilicon layer.

DESCRIPTION OF THE PREFERRED EMBODIMENTS

Figure 1:
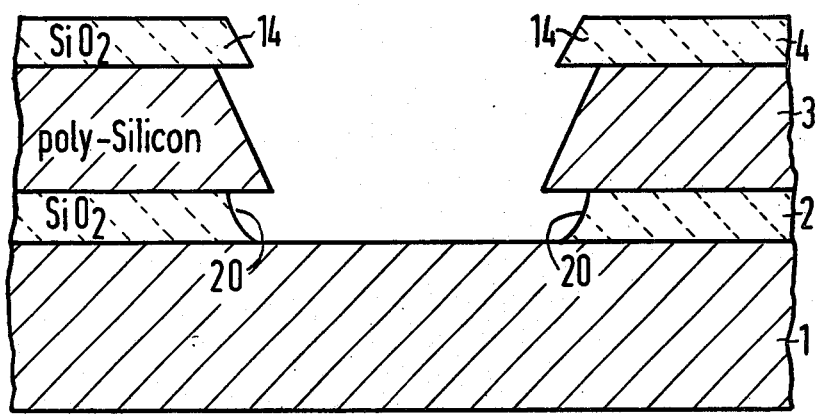
FIG. 1 shows an example of an etching structure in a layer sequence consisting of a first silicon dioxide layer, a polycrystalline silicon layer, and a second silicon dioxide layer on a silicon substrate which is provided with an etched structure produced by a wet-chemical etching process whereby this etched structure exhibits sub-etchings.
Figure 2:
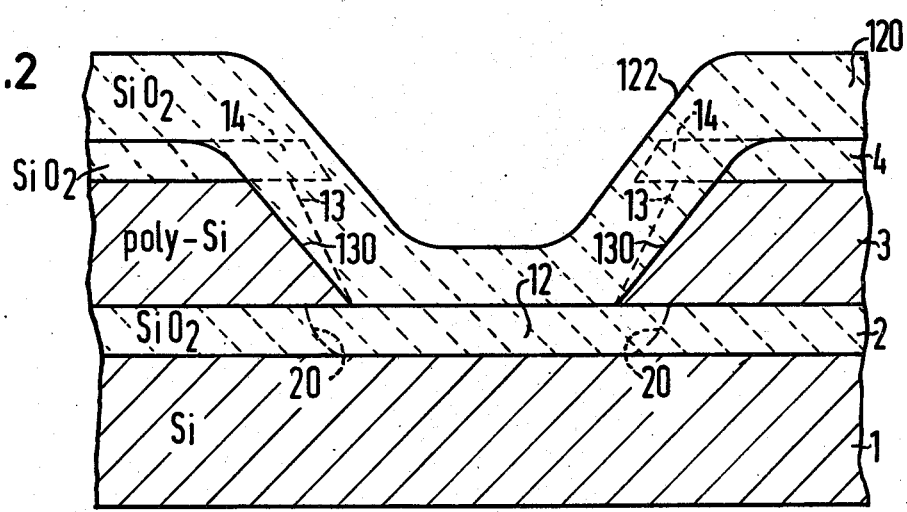
FIGS. 2 and 3 schematically illustrate how the sub-etchings are filled and the overhanging sides of the under-etching or sub-etching structures are removed or sloped with the aid of the method of the invention.

The application of a silicon dioxide layer onto a multiple layer provided with an etched structure, is illustrated in FIG. 1 as an example of the method of the invention. This multiple layer consists of a first silicon dioxide layer 2, a polysilicon layer 3, and a second silicon dioxide layer 4 which are situated on a silicon substrate 1. A grid potential is applied to the substrate which, for example, has a voltage which is 24% of the target voltage of the sputtering source. Accordingly, an $SiO_2$ layer 12 is deposited on the substrate surface which completely fills the under-etching or sub-etching 20 of the $SiO_2$ layer 2 on the polysilicon layer by re-emission from a surface of the substrate. During this sputter deposition of the $SiO_2$ layer 12, the polysilicon layer 3 is simultaneously sloped at its edges so that, in contrast to the original edge line 13, illustrated by hatchings in FIG. 2, a new edge line 130 of this polysilicon layer is formed. Since the re-emission of the sputtered-on $SiO_2$ particles is relatively great at a substrate grid potential of about 24%, the $SiO_2$ layer 4, situated on the polysilicon layer 3, hardly increases in thickness. However, because of the high re-emission rate, the overhanging structure 14 of this $SiO_2$ layer 4 is removed. In further steps of the process, the substrate grid potential of 24% is then, for example, reduced to half, that is, to 12%. In this case, the re-emission rate for the $SiO_2$ particles to be sputtered-on also decreases so that a layer 120 of $SiO_2$ is deposited whose edge line is indicated by the line 122. This layer 120—in relation to the earlier used method—does not exhibit any hollow spaces in which contaminants could be situated. A conductor path or a polycrystalline layer could certainly also be deposited in the described manner instead of $SiO_2$ layers 12 and 120.

Figure 3:
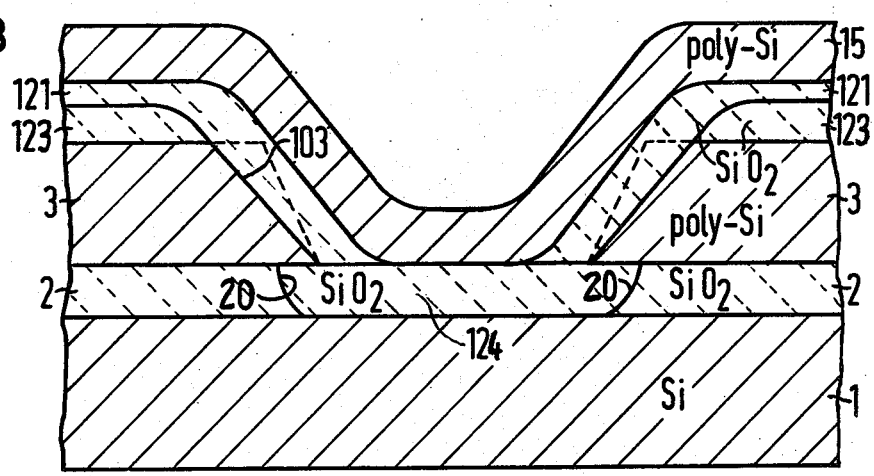

FIG. 3 schematically illustrates how $SiO_2$ layers 123 and 124 are deposited by sputtering onto a structure consisting of a silicon substrate 1, a silicon dioxide layer 2, and a polycrystalline silicon layer 3. First the $SiO_2$ layers 123 and 124 are sputter deposited by connection of a grid potential to the substrate. During the deposition of $SiO_2$ layers 124 and 123 the sub-etching 20 is completely filled and simultaneously the layer of polycrystalline silicon 3 is provided with a less sloping side 103. After this process step has been completed, the substrate, provided with the layer structure, is exposed to a heat treatment in an $O_2$ atmosphere so that the side region 103 of the polycrystalline silicon layer, which has not yet been covered with $SiO_2$ after the sputter deposition of the silicon dioxide, is transformed into an $SiO_2$ layer 121 by means of this thermal process. After this has been completed, polycrystalline silicon is deposited as layer 15 on the silicon dioxide layers 124 and 121 with the aid of a CVD process. One also obtains a structure in this case which is free from hollow spaces in the region of the under-etchings.

Figure 4:
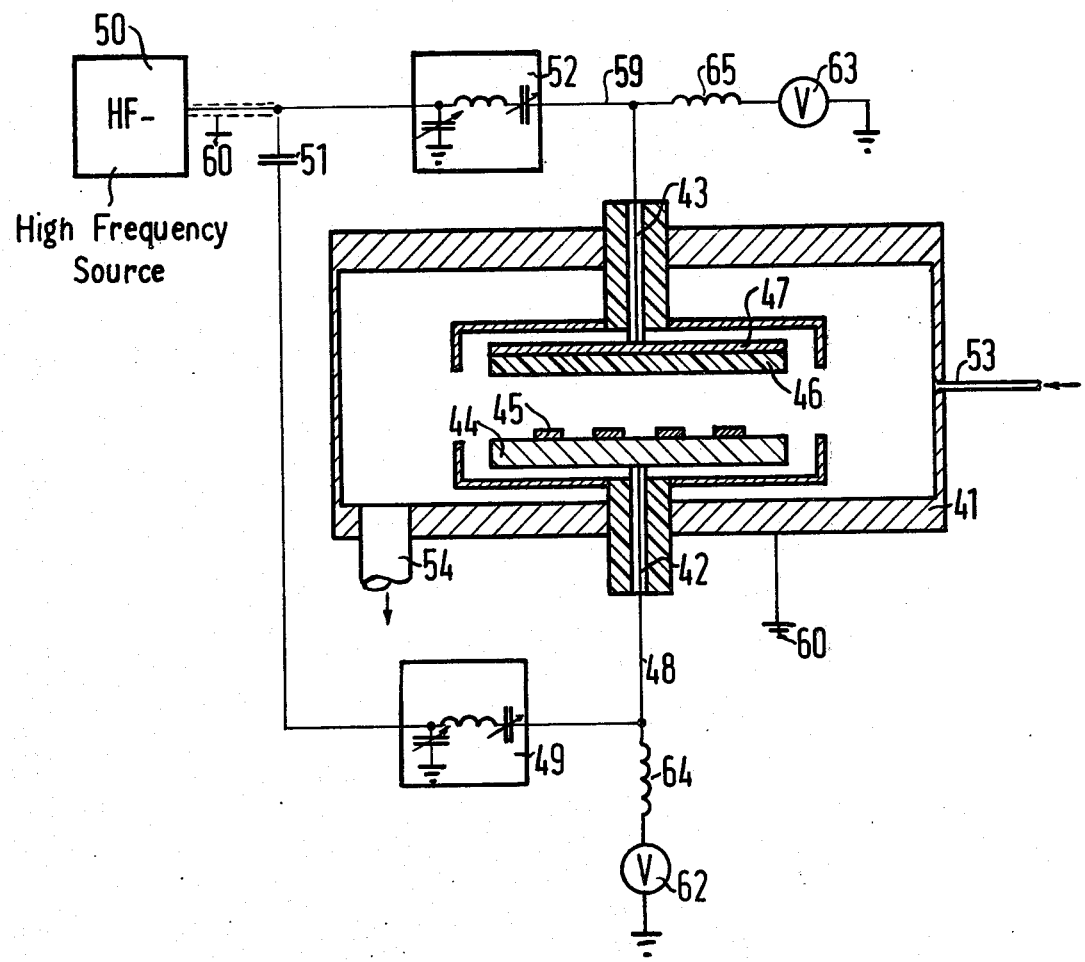
FIG. 4 schematically illustrates the equipment used for carrying-out the method of the invention.

FIG. 4 schematically illustrates the equipment utilized for carrying-out the inventive method. This equipment consists of an evacuated receptacle 41 which is provided with two high frequency current lead-in wires 42 and 43. A substrate support 44 is situated in the interior of the evacuatable receptable 41 on which the substrate disks 45 are situated. The target, for example, a $SiO_2$ target 46, is arranged over the substrate support. This target is mounted to a target support 47. The substrate support 44 is connected to a high frequency generator 50 via a high frequency line 48 which is brought to the interior of the receptacle 41 via the high frequency insulated lead-in wire 42. A tuning or adjusting network 49 and a coupling capacitor 51 are connected between the output of the high frequency generator 50 and to the substrate support 44. The target support 47 is also connected to the high frequency generator 50 via a high frequency line which is brought through the wall of the receptacle 41 by the insulated lead-in wire 43. An additional tuning network 52 is connected between the target support 47 and the high frequency generator 50. The high frequency voltage feed lines to the coupling capacitor 51 and the tuning network 52 proceed via a coaxial cable, for example, via a 50Ω cable. The ground side of the high frequency generator and the receptacle 41 are grounded to the same ground wire 60. The operation of the arrangement proceeds as follows. The receptacle 41 is evacuated via pump line 54 and subsequently argon is admitted with a pressure of between 3.0 and $3.5 \times 10^3$ Torr via gas inlet 53, for example. A HF voltage of approximately 1500 V is applied to the target. The tuning network 52 is used for the adjustment and setting of the voltage. The tuning network 49 is adjusted such that a voltage is applied to the substrate support which amounts to between 10 and 30% of the target voltage. The measurement of the target voltage and of the substrate voltage proceeds with the aid of two voltmeters 62 and 63 which are respectively connected to the substrate feed line 48 or the HF feed line 59 via high frequency chokes 64 or 65. The other side of the voltmeters is connected to the ground line 60.

Although various minor modifications may be suggested by those versed in the art, it should be understood that I wish to embody within the scope of the patent warranted hereon, all such embodiments as reasonably and properly come within the scope of my contribution to the art.

I claim as my invention:

1. A method for covering a first layer means comprising an etched structure situated on a substrate and having under-etchings with a second layer by means of sputter depositing material from a high frequency sputtering source with a given target voltage, comprising the steps of: applying a grid potential to the substrate during said sputter depositing in order to fill the under-etchings, said grid potential amounting to between one-tenth and one-third of the target voltage applied to the sputtering source.

2. A method in accordance with claim 1, including the steps of applying a first grid potential to the substrate; and altering the grid potential during the sputter depositing process such that the re-emission rate for the sputter deposited material decreases relative to the re-emission rate during application of said first grid potential.

3. A method in accordance with claim 1, including the step of depositing an additional layer of material after the sputter deposition process by means of a CVD process.

4. A method in accordance with claim 1, including the step of depositing an additional layer after the sputter deposition process by means of a thermal oxidation process.

5. A method in accordance with claim 1, wherein the sputter deposited material fills in under-etchings adjacent to the substrate and slopes under-etchings above the substrate.

6. A method for eliminating under-etchings wherein a substrate is provided having a lower $SiO_2$ layer thereon, a polysilicon layer on the $SiO_2$ layer, and an upper $SiO_2$ layer on the polysilicon layer, an etched window in the layers, a first under-etching being formed at an edge of the lower $SiO_2$ layer in the etched window, and a second under-etching being formed at an edge of the polysilicon layer in the etched window, comprising the steps of: providing a sputtering source with a given target voltage; and applying a grid potential to the substrate, said grid potential amounting to between one-tenth and one-third of the target voltage; sputter depositing a layer in the etching window for filling in the first under-etching by re-emission from the surface of the substrate, sloping the edge of the polysilicon layer at the second under-etching, and removing an overhanging portion of the upper silicon dioxide layer at the second under-etching by re-emission during the sputter depositing.

7. The method of claim 6, including the further step of reducing the grid potential on the substrate after said sputter depositing and sputter depositing an additional layer in the etching window at the reduced potential.

8. The method of claim 6 in which the sputter deposited layer is silicon dioxide.

9. The method of claim 6 in which the sputter deposited layer is polysilicon.

10. The method of claim 6 in which the sputter deposited layer is a conductor path.

11. A method for eliminating under-etchings wherein a structure is provided comprising a substrate having a lower layer and an upper layer, an under-etching being formed at a lateral edge of the lower layer adjacent the substrate in an etched window through the lower and upper layers, comprising the steps of: providing a sputtering source with a given target voltage; applying a grid potential to the substrate, said grid potential amounting to between one-tenth and one-third of the target voltage; and sputter depositing on a layer in the etched window for filling in the under-etching by re-emission from the surface of the substrate.

* * * * *